United States Patent [19]

Salvagno

[11] Patent Number: 4,927,367
[45] Date of Patent: May 22, 1990

[54] SELECTIVE GROUNDING DEVICE FOR ELECTRONIC EQUIPMENT

[75] Inventor: Elvio Salvagno, Caluso, Italy

[73] Assignee: Bull HN Information Systems Italia S.p.A., Caluso, Italy

[21] Appl. No.: 320,258

[22] Filed: Mar. 7, 1989

[30] Foreign Application Priority Data

Mar. 15, 1988 [IT] Italy .................. 19772 A/88

[51] Int. Cl.$^5$ .................................................. H01R 4/66
[52] U.S. Cl. .......................................... 439/92; 439/52; 439/97; 200/507
[58] Field of Search ................ 439/92, 65, 75, 95, 439/45–49, 52; 200/280, 281, 507

[56] References Cited

U.S. PATENT DOCUMENTS 2,854,552  9/1958  Gouverneur ............... 439/75 X

FOREIGN PATENT DOCUMENTS 0019836 12/1980 European Pat. Off. ........... 439/48
1300587  3/1987 U.S.S.R. ............................ 439/92

OTHER PUBLICATIONS

"Programmable Through-Hole Connection", Glasson et al., Western Electric Tech. Dig. No. 20, 10-1970, pp. 33–34.

Primary Examiner—Eugene F. Desmond
Attorney, Agent, or Firm—John S. Solakian; Gerald J. Cechony

[57] ABSTRACT

Selective grounding device for electronic equipment comprising a printed circuit board fastened to a grounding frame by a fastening screw inserted through an opening of the board comprising a first conductive pad surrounding the opening and located on the board side contacting the frame, a second and a third conductive pads, insulated from each other surrounding the opening on the opposite side of the board, the second pad being electrically connected to the first one, the third pad being electrically connected to the DC ground of the equipment, a washer selectively conductive or insulating, overlaying the second and third pad and clamped on said pads by the fastening screw, so that the DC ground is selectively connected or insulated form the frame ground depending on the washer being conductive or insulating, without need to differentiate, to this purpose, the printed circuit board.

2 Claims, 1 Drawing Sheet

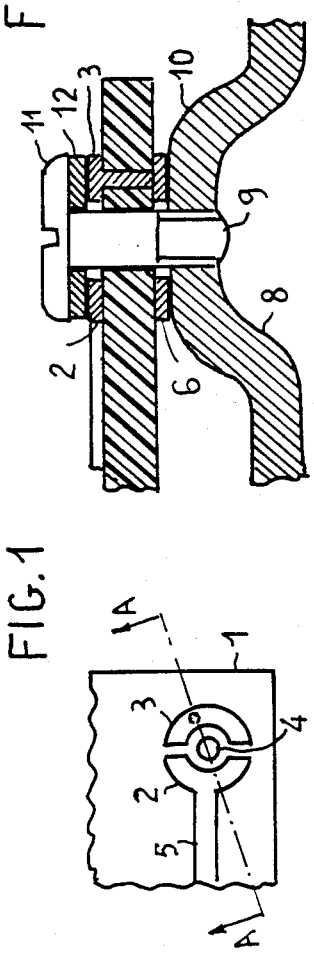
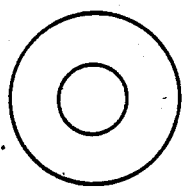
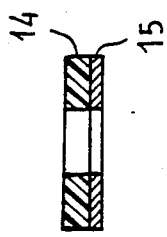
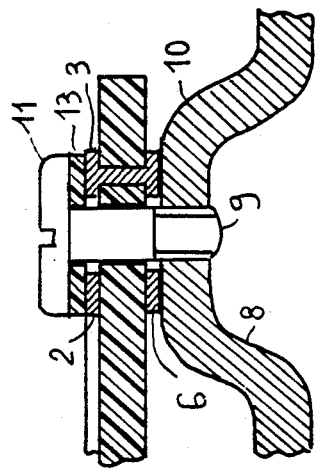
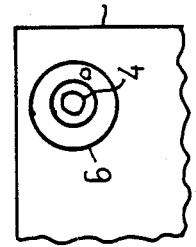

SELECTIVE GROUNDING DEVICE FOR ELECTRONIC EQUIPMENT

The present invention relates to a selective grounding device for electronic equipment, in particular for equipment implemented with printed circuit boards or PCB's.

This kind of equipment is generally housed in cabinets or metal frames which, for safety reasons, are provided with grounding means.

Even when such cabinets or frames are of plastics, always metal inserts or metal screens are always present, which have to be grounded.

Electronic equipment mounted on printed circuit boards is powered by power supplies which generate a DC powering voltage, available at two terminals.

One of the terminals is defined as a voltage source terminal, the other as DC ground.

Depending on the type of installation the DC ground must be either grounded to the frame, or insulated from the frame.

This is especially true for installation comprising several equipments electrically connected to each other and spatially distributed at locations which may have a different ground potential.

The connection of the equipments at several ground points may form electrically conductive circuits which are unbalanced and may cause the generation of significant parasitic currents which affect the equipment and hamper its operation.

A solution commonly adopted for electrical connection of the DC ground to the frame ground is to provide on the lower face of a printed circuit board a conductive metal pad surrounding a hole formed in the board, the pad being electrically connected to the conventional DC ground of the circuit.

A screw, inserted in the hole and screwed in a metal protruding post of the frame, once clamped, provides the electrical continuity and the contact of the pad with the post.

It further provides the fastening of the PCB to the frame.

If, for the same equipment, the electrical connection between DC ground and frame ground has to be avoided, it is required to have PCB's which do not have the conductive pad.

This implies, for the same equipment, the manufacturing of two different kinds of printed circuit boards which cannot be modified or interchanged at the installation site or "in the field".

This further results in a higher manufacturing and stock handling cost.

These disadvantages and limitations are overcome by the selective grounding device for electronic equipment of the present invention which essentially consists in the conductive pad already indicated and located on the lower face of a PCB, and in two conductive half pads, insulated from each other and located on the upper face of the PCB, juxtaposed to the already mentioned pad.

One of the two half-pads is electrically connected to DC ground, the other half pad is electrically connected to the lower pad by means of a plated-through hole connection in the board.

When the PCB is fastened to the frame by means of a clamping screw, either a conductive or insulating washer, depending on needs, is inserted below the screw head and provides, depending on the case, the required electrical connection of the two half pads, or the required insulation.

As a consequence, it is no longer required to differentiate the products by production of different PCB's, and it is only at the moment of installing the PCB into the frame that the ground connection is characterized.

In addition, it is clear that modification of the ground connection can easily be performed in the field and requires the substitution of an insulating washer with a conductive one, or vice versa, or even, as it will become more clear from the following, the simple turning over of the washer on the screw axis, the washer being a composite one and having a conductive side and an insulating side.

These and other features will become more clear from the following description of a preferred form at embodiment and from the enclosed drawings where:

FIGS. 1, 2, 3 show respectively in top, bottom and sectional view some components of the selective grounding device of the invention, implemented on a printed circuit board FIGS. 4, 6 are a sectional view of the selective grounding device of the invention in case of grounding or insulation, respectively.

FIGS. 5, 7 show in top view and sectional view a component of the selective grounding device of the invention.

FIGS. 1, 2, 3 respectively show in top, bottom and sectional view (according to line A—A of FIG. 1) a portion of printed circuit board 1.

The upper side of board 1 bears two conductive pads 2,3, in form of two semicircles surrounding an opening 4.

Pad 2 is connected to a conductive lead 5 which constitutes the DC ground for electrical components mounted on the board and not shown.

Pads 2,3 and lead 4 are obtained with the well-known manufacturing processes for obtaining printed circuits (masking, exposing, etching).

The lower side of board 1 bears a conductive pad 6 of circular form, surrunding opening 4 and juxtaposed to pads 2,3.

Opening 4 is not metallized and its edges are spaced apart from the inner edge of pads 2,3,6 by a non conductive corona having a suitable width.

As better shown in the section of FIG. 4 a conductive "via" 7, obtained by "plating-through" an opening in the insulating support of the board, electrically connects pad 3 with the lower pad 6.

Although in FIGS. 1 and 2 the pads are shown as having a round shape, it is clear that the shape may be different: for instance they may have an external rectangular shape.

FIG. 4 is a sectional view of the board 1, fastened to a supporting metal frame 8, by a screw 9.

Frame 8 has a projecting part 10, obtained by drawing or material adding and having a threaded seat for receiving the screw 9.

Between the head 11 of screw 9 and the board 1 a conductive washer 12, for instance of copper, is inserted.

Washer 12 lays down on two pads 2,3 and assures the electrical coupling of the same.

The clamping action performed by the screw provides a contact pressure which guarantees an excellent electrical contact and electrical continuity between the two pads 2,3 and washer 12 on one side and the lower pad 6 and the frame projecting part 10 on the other.

In this way a reliable electrical connection is obtained between DC ground and frame ground.

In FIG. 5, washer 12 is shown in top view.

In equipment where the connection between DC ground and frame ground must be avoided, it suffices to fasten the printed circuit board 1 to the frame, by replacing washer 12 with a washer 13 of similar form, but obtained from insulating material as shown in FIG. 6.

Thus, by the simple substitution of a washer and without any other change in the equipment it is possible to obtain a selective ground connection.

Moreover it is clear that washer 12 and washer 13 may be replaced by a single washer, of which FIG. 7 is a section view, and consisting in an insulating support 14, for instance of the same material used for manufacturing printed circuit boards and bearing on one side a layer 15 of conductive material, for instance copper.

In this way, by the use of a single washer, and depending on the conductive side being placed in contact with the screw head or with the two pads 2,3 the required electrical insulation or the required electrical connection between DC ground and frame ground is obtained.

The device of the invention in addition of being reliable and effective is particularly simple and inexpensive relative to other devices, such as posts inserted in the board and removable connection straps.

Beyond that it has a very reduced encumbrance or no encumbrance at all if it considered that at least a clamping screw may be functionally required and provided for this purpose.

What is claimed is:

1. Selective grounding device for electronic equipment comprising at least a printed circuit board clamped to a ground frame by means of at least a screw inserted through an opening of the board and screwed into the ground frame, comprising a first conductive pad surrounding said opening and located on the board side contacting the frame, a second and third conductive pads, each insulated from the other, surrounding said opening on the other board side, the second of said pads being electrically connected to said first one, the third of said pads being electrically connected to the board's DC ground, and a washer, selectively insulating or conductive, overlaying said second and third pads and clamped against said second and third pads by said clamping screw.

2. Selective grounding device as in claim 1, wherein said washer consists of an insulating substrate bearing on one side a conductive material layer, the connection between DC ground and frame ground being obtained by inserting said washer on said clamping screw with the conductive material layer contacting said second and third pads, the insulation between DC ground and frame ground being obtained by inserting said washer on said clamping screw with the insulating substrate contacting said second and third pads.

* * * * *